(12) United States Patent
Wang et al.

(10) Patent No.: US 11,688,717 B2
(45) Date of Patent: Jun. 27, 2023

(54) MECHANICAL WAFER ALIGNMENT DETECTION FOR BONDING PROCESS

(71) Applicant: Taiwan Semiconductor Manufacturing Company, Ltd., Hsinchu (TW)

(72) Inventors: Ching-Hung Wang, Hsinchu (TW); Yeong-Jyh Lin, Caotun Township (TW); Ching I Li, Tainan (TW); Tzu-Wei Yu, Hsinchu (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/412,596

(22) Filed: Aug. 26, 2021

(65) Prior Publication Data

US 2023/0066893 A1 Mar. 2, 2023

(51) Int. Cl.
*H01L 23/00* (2006.01)
*H01L 21/68* (2006.01)

(52) U.S. Cl.
CPC ............ *H01L 24/83* (2013.01); *H01L 21/681* (2013.01); *H01L 24/98* (2013.01); *H01L 2224/8393* (2013.01); *H01L 2224/83136* (2013.01)

(58) Field of Classification Search
CPC ............ H01L 2224/8312; H01L 2224/83122; H01L 2224/83127; H01L 2224/83136; H01L 2224/83138; H01L 2224/83139; H01L 2224/8314; H01L 2224/83141; H01L 2221/68304–68395
See application file for complete search history.

(56) References Cited

U.S. PATENT DOCUMENTS

| | | | |
|---|---|---|---|
| 2007/0238201 A1* | 10/2007 | Funk | H01L 22/12 257/E21.53 |
| 2020/0159133 A1* | 5/2020 | Yan | H01L 24/80 |
| 2021/0043488 A1* | 2/2021 | Toshima | H01L 21/681 |

* cited by examiner

*Primary Examiner* — Julio J Maldonado
*Assistant Examiner* — Stanetta D Isaac
(74) *Attorney, Agent, or Firm* — Eschweiler & Potashnik, LLC

(57) ABSTRACT

Various embodiments of the present disclosure are directed towards a method for forming a semiconductor structure. The method includes loading a first wafer and a second wafer onto a bonding platform such that the second wafer overlies the first wafer. An alignment process is performed to align the second wafer over the first wafer by virtue of a plurality of wafer pins, where a plurality of first parameters are associated with the wafer pins during the alignment process. The second wafer is bonded to the first wafer. An overlay (OVL) measurement process is performed on the first wafer and the second wafer by virtue of the plurality of wafer pins, where a plurality of second parameters are associated with the wafer pins during the alignment process. An OVL shift is determined between the first wafer and the second wafer based on a comparison between the first parameters associated with the wafer pins during the alignment process and the second parameters associated with the wafer pins during the OVL measurement process.

20 Claims, 11 Drawing Sheets

MECHANICAL WAFER ALIGNMENT DETECTION FOR BONDING PROCESS

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconductor material. After fabricating integrated circuits on a first wafer, the first wafer may be bonded to a second wafer. Wafer edge trimming and/or wafer thinning may be used to remove and/or prevent damage to the first and second wafers after bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
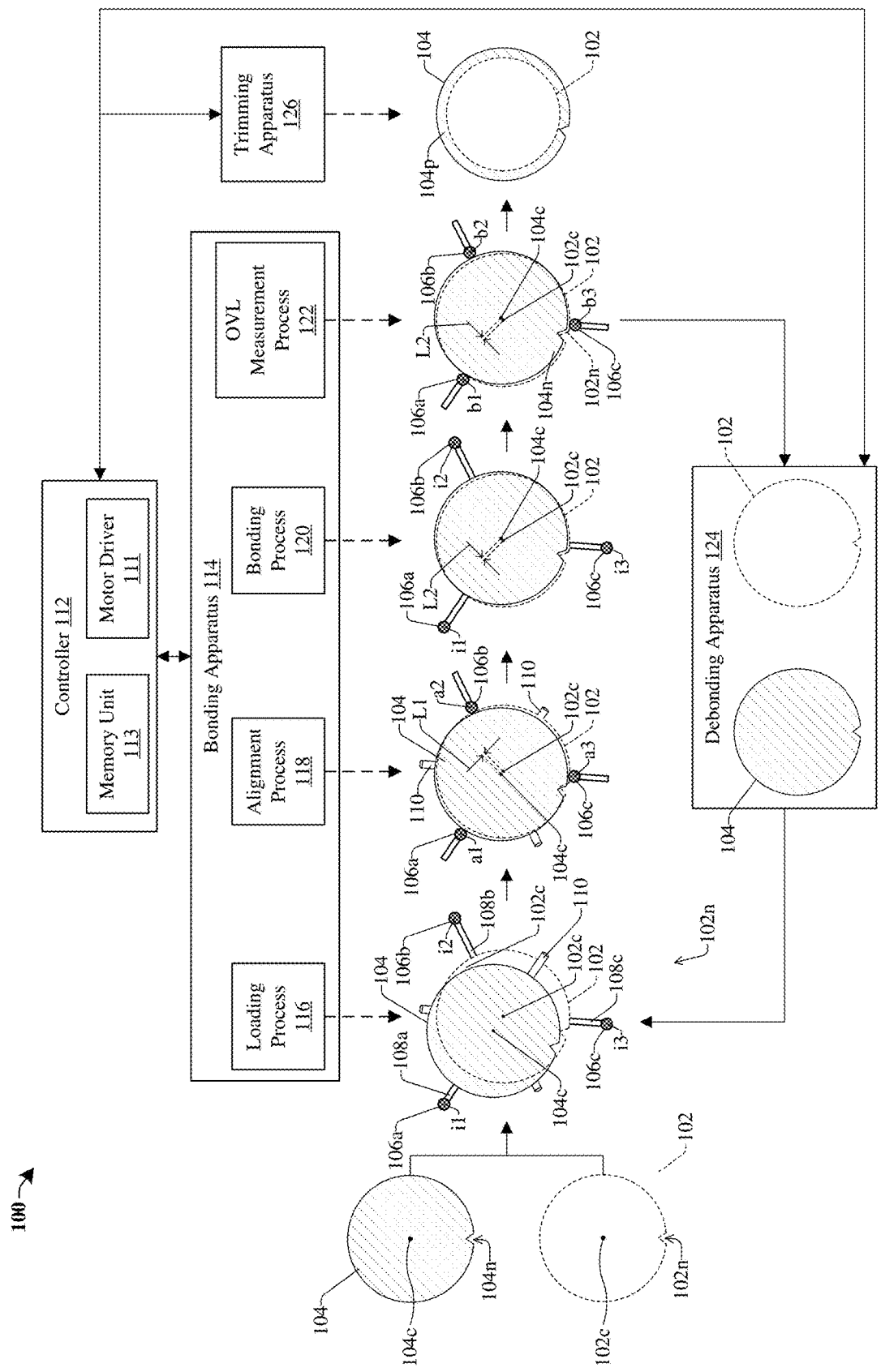
FIG. 1 illustrates some embodiments of a schematic of a processing system configured to perform an overlay (OVL) shift measurement process by virtue of a plurality of wafer pins on a stack of bonded wafers.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

A semiconductor structure may comprise a first wafer and a second wafer bonded to and arranged over the first wafer. One possible method to manufacture the semiconductor structure includes performing a bonding process to bond the second wafer to the first wafer and subsequently performing a thinning process and/or a wafer edge trimming process on the second wafer. During the bonding process, the second wafer is loaded into a bonding device and is disposed over the first wafer by virtue of a wafer bonding apparatus. The wafer bonding apparatus comprises a plurality of wafer pins that may be configured to move along one or more tracks. The wafer pins are configured to guide the second wafer over the first wafer and mechanically-align the second wafer over the first wafer by virtue of wafer features (e.g., circumferential edges of the first and second wafers). Thereafter, the second wafer is bonded to the first wafer. Subsequently, a thinning process and/or a trimming process may be performed on the first wafer to reduce a thickness of the first wafer and to remove a peripheral region of the first wafer from over the second wafer. Further, additional processing steps may be performed on the first wafer to form semiconductor devices, input/output structures, or the like on/over the first wafer.

One challenge with the above semiconductor structure manufacturing method is misalignment between the first wafer and the second wafer during/after the bonding process. For example, a misalignment distance between a center of the first wafer and a center of the second wafer after the bonding process may be relatively large (e.g., greater than about 200 micrometers (um)). The relatively large misalignment distance may cause the first wafer to have a large total thickness variation (TTV) after performing a thinning process on the first wafer. Further, the relatively large misalignment distance may result in peeling of the first wafer away from the second wafer during and/or after the trimming process. The large TTV and peeling of the first wafer away from the second wafer may cause complications during subsequent processing steps and/or may decrease a performance of semiconductor devices disposed within/on the first wafer. Further, the relatively large misalignment distance may be equal to or greater than a misalignment threshold of other processing tools (e.g., a photolithography tool, a packing tool, a dicing tool, etc.), such that the bonded first and second wafers are rejected for subsequent processing steps, thereby decreasing device yield.

Various embodiments of the present disclosure relate to an improved semiconductor manufacturing process (and associated processing system) for bonding a second wafer to a first wafer. The semiconductor manufacturing process utilizes a wafer bonding apparatus having a plurality of wafer pins that may be configured to move along one or more tracks. First, the first and second wafers are loaded into the wafer bonding apparatus. An alignment process is performed on the first and second wafers by virtue of the plurality of wafer pins, where a plurality of first parameters are associated with the wafer pins during the alignment process. The alignment process may, for example, include moving each wafer pin along a corresponding track from an initial position, in a direction towards a center of the first wafer, to a first position. After performing the alignment process, the second wafer is bonded to the first wafer. In various embodiments, a center of the second wafer may be shifted relative to the center of the first wafer during the bonding process. Subsequently, an overlay (OVL) measurement process is performed on the bonded first and second wafers by virtue of the plurality of wafer pins, where a plurality of second parameters are associated with the wafer pins during the OVL measurement process. An OVL shift is determined between the first and second wafers based on a comparison between the first parameters and the second parameters. The OVL shift may, for example, correspond to the shift between centers of the first and second wafers during the bonding process. If the OVL shift is less than an OVL threshold value, then the bonded first and second wafers may proceed to subsequent processing steps such as, for example, a trimming process, a thinning process, etc. This, in part, may prevent peeling of the second wafer from the first wafer during subsequent processing steps (e.g., during a trimming process), thereby increasing a performance and reliability of semiconductor devices disposed along the first and/or second wafers.

Further, if the OVL shift is greater than the OVL threshold value, then the bonded first and second wafers are transferred to a debonding apparatus where the second wafer is debonded from the first wafer. One or more rework processes (e.g., deposition process(es), planarization process(es), etc.) may be performed on the first wafer and the second wafer. Subsequently, the first and second wafers are reloaded into the wafer bonding apparatus and the above semiconductor manufacturing process may be repeated until the OVL shift between the first and second wafers after the bonding process is less than the OVL threshold value. This prevents the bonded first and second wafers from being rejected for subsequent processing stops, thereby reducing waste in manufacturing the semiconductor structure and increasing device yield.

FIG. 1 illustrates some embodiments of a schematic of a processing system 100 configured to perform a wafer bonding process on a first wafer 102 and a second wafer 104. According to the processing system 100, the first wafer 102 and the second wafer 104 are configured to pass through a bonding apparatus 114, a trimming apparatus 126, and/or a debonding apparatus 124, where the first and second wafers 102, 104 go through a set of semiconductor manufacturing processes.

In some embodiments, a circumferential edge of the first wafer 102 is circular but for the presence of a notch 102n, and a circumferential edge of the second wafer 104 is circular but for the presence of a notch 104n. The notches 102n, 104n of the first and second wafers 102, 104 may, for example, be configured as alignment notches. In some embodiments, the first and second wafers 102, 104 may each comprise a semiconductor material such as, for example, silicon, germanium, another suitable semiconductor material, or any combination of the foregoing. In yet further embodiments, the first wafer 102 may be part of a first integrated circuit (IC) structure, where a first interconnect structure (not shown) is disposed on the first wafer 102. Further, a first plurality of semiconductor devices (e.g., transistors, varactors, or another suitable semiconductor device) may be disposed within and/or on the first wafer 102. In various embodiments, the second wafer 104 may be configured as a handle wafer.

In various embodiments, the first and second wafers 102, 104 may be disposed on a conveyor apparatus (not shown) that is configured to transfer the first and second wafers 102, 104 between the bonding apparatus 114, the trimming apparatus 126, and/or the debonding apparatus 124. During operation of the processing system 100, the first and second wafers 102, 104 first pass through the bonding apparatus 114. The bonding apparatus 114 is configured to perform a first set of processing steps on the first and second wafers 102, 104. For example, the first set of processing steps may include a loading process 116, an alignment process 118, a bonding process 120, and an overlay (OVL) measurement process 122.

During the loading process 116, the first and second wafers 102, 104 are loaded onto a bonding platform that comprises a plurality of wafer pins 106a-c and a plurality of wafer pin tracks 108a-c. The first and second wafers 102, 104 are loaded such that the second wafer 104 overlies the first wafer 102. A plurality of spacer structures 110 are disposed over the first wafer 102 such that the spacer structures 110 are spaced vertically between the first wafer 102 and the second wafer 104. Each wafer pin in the plurality of wafer pins 106a-c is disposed along a corresponding wafer pin track in the plurality of wafer pin tracks 108a-c. The wafer pins 106a-c are each configured to traverse the corresponding wafer pin track by virtue of a motor. The plurality of wafer pins 106a-c comprises a first wafer pin 106a, a second wafer pin 106b, and a third wafer pin 106c. Further, the plurality of wafer pin tracks 108a-c comprises a first wafer pin track 108a, a second wafer pin track 108b, and a third wafer pin track 108c In some embodiments, each motor associated with the corresponding wafer pin 106a-c is operably coupled to gears (not shown) and a belt (not shown) that wraps around hubs of the gears and is driven by the motor. The gears and the belt are disposed along each one of the wafer pin tracks 108a-c and when the motor rotates, the motor in turn rotates the gears via a driveshaft (not shown) and the gears move the belt, which is attached to the corresponding wafer pin 106a-c. In this way, the wafer pins can be moved along the corresponding wafer pin track 108a-c. Mechanisms other than a motor and belt can be used to move each wafer pin 106a-c, for example, in other embodiments, actuators, hydraulic pressure, magnetic fields, or electric fields can be used.

In various embodiments, the first wafer pin 106a is configured to traverse the first wafer pin track 108a by virtue of a first motor (not shown), the second wafer pin 106b is configured to traverse the second wafer pin track 108b by virtue of a second motor (not shown), and the third wafer pin 106c is configured to traverse the third wafer pin track 108c by virtue of a third motor (not shown). Further, after loading the first and second wafers 102, 104 onto the bonding platform, the plurality of wafer pins 106a-c are each disposed at an initial position on the corresponding wafer pin track. For example, the first wafer pin 106a is disposed at a first initial position i1 along the first wafer pin track 108a, the second wafer pin 106b is disposed at a second initial position i2 along the second wafer pin track 108b, and the third wafer pin 106c is disposed at a third initial position i3 along the third wafer pin track 108c.

A controller 112 is configured to control the bonding apparatus 114 and other components of the processing system 100. A two-way connection exists between the controller 112, the trimming apparatus 126, the debonding apparatus 124, and/or a memory unit 113. The memory unit 113 may include any type of storage device configured to store data, programs, and/or other information. In some embodiments, the memory unit 113 may include, for example, one or more of a hard disk drive, a magnetic disk drive, an optical disk drive, another suitable storage device, or any combination of the foregoing. Further, the controller 112 comprises a motor driver 111 that is configured to control the motors associated with the plurality of wafer pins 106a-c. For example, the motor driver 111 is configured to apply one or more motor signals to each motor associated with the wafer pins 106a-c to move the wafer pins 106a-c along the corresponding wafer pin track 108a-c. In various embodiments, the motor signals may include a voltage, a current, or the like.

After the loading process 116, the bonding apparatus 114 is configured to perform an alignment process 118 on the first and second wafers 102, 104. In some embodiments, the alignment process 118 may be referred to as a mechanical alignment process and is performed by virtue of the plurality of wafer pins 106a-c, where a plurality of first parameters are associated with the wafer pins 106a-c during the alignment process 118. For example, the alignment process 118 includes applying alignment motor signal(s) (e.g., a current, a voltage, etc.) to each motor associated with the plurality of wafer pins 106a-c by virtue of the motor driver 111. Application of the alignment motor signal(s) causes each wafer pin 106a-c to traverse the corresponding wafer pin track 108a-c from the initial positions i1-3, in a direction towards a center 102c of the first wafer 102, to an alignment position. This, in part, facilitates alignment of the second wafer 104 over the first wafer 102. In some embodiments, applying a first alignment motor signal to the first motor associated with the first wafer pin 106a causes the first wafer pin 106a to move from the first initial position i1 to a first alignment position a1; applying a second alignment motor signal to the second motor associate with the second wafer pin 106b causes the second wafer pin 106b to move from the second initial position i2 to a second alignment position a2; and applying a third alignment motor signal to the third motor associated with the third wafer pin 106c causes the third wafer pin 106c to move from the third initial position i3 to a third alignment position a3. In yet further embodiments, the plurality of first parameters associated with the wafer pins 106a-c during the alignment process 118 may include, the alignment motor signals applied to each motor during the alignment process 118, a speed of each wafer pin 106a-c during the alignment process 118, a torque applied by each motor during the alignment process 118, a number of rotations performed by each driveshaft during the alignment process 118, the plurality of alignment positions a1-3, and/or other suitable parameters.

In various embodiments, the plurality of first parameters associated with the wafer pins 106a-c during the alignment process 118 (e.g., values from the first, second, and third alignment motor signals, values from the alignment positions a1-3, etc.) may be stored in the memory unit 113 of the controller 112. In yet further embodiments, after the alignment process 118, the center 104c of the second wafer 104 is laterally offset from the center 102c of the first wafer 102 by a first lateral distance L1. In some embodiments, the first lateral distance L1 may be non-zero. In yet further embodiments, after the alignment process 118, the center 104c of the second wafer 104 directly overlies the center 102c of the first wafer 102 (not shown), such that the first lateral distance L1 is zero. In yet further embodiments, the first lateral distance L1 may, for example, be determined and/or calculated based on the plurality of first parameters.

After the alignment process 118, the bonding apparatus 114 is configured to perform a bonding process 120 on the first and second wafers 102, 104. In various embodiments, the bonding process 120 includes removing the spacer structures 110 from between the first and second wafers 102, 104; applying motor signal(s) to the motors associated with the plurality of wafer pins 106a-c to move each wafer pin back to a corresponding initial position; and subsequently bonding the second wafer 104 to the first wafer 102. In various embodiments, the bonding process 120 includes performing a hybrid bonding process, a eutectic bonding process, a fusion bonding process, another suitable bonding process, or any combination of the foregoing. In further embodiments, the center 104c of the second wafer 104 may laterally shift from the center 102c of the first wafer 102 during the bonding process 120, such that the centers 102c, 104c of the first and second wafers 102, 104 are laterally offset from one another by a second lateral distance L2. In some embodiments, the centers 102c, 104c of the first and second wafers 102, 104 shift relative to their positions immediately after the alignment process 118, such that the second lateral distance L2 is different from the first lateral distance L1. In further embodiments, the second lateral distance L2 is non-zero.

After the bonding process 120, the bonding apparatus 114 is configured to perform an OVL measurement process 122 on the bonded first and second wafers 102, 104. In an embodiment, the OVL measurement process 122 is performed by virtue of the plurality of wafer pins 106a-c, where a plurality of second parameters are associated with the wafer pins 106a-c during the OVL measurement process 122. For example, the OVL measurement process 122 includes applying OVL measurement motor signal(s) (e.g., a current, a voltage, etc.) to each motor associated with the plurality of wafer pins 106a-c by virtue of the motor driver 111. Application of the OVL measurement motor signal(s) causes each wafer pin 106a-c to traverse the corresponding wafer pin track 108a-c from the initial positions i1-3, in a direction towards the bonded first and second wafers 102, 104, to a corresponding OVL measurement position b1-3. In various embodiments, values from the OVL measurement motor signals and/or the OVL measurement positions b1-3 may be used to detect and/or determine the second lateral distance L2 between the centers 102c, 104c of the first and second wafers 102, 104. Subsequently, the controller 112 is configured to perform a comparison between the plurality of first parameters associated with the wafer pins 106a-c during the alignment process 118 and the plurality of second parameters associated with the wafer pins 106a-c during the OVL measurement process 122 to determine and/or measure an OVL shift between centers 102c, 104c of the first and second wafers 102, 104. The OVL shift may, for example, correspond to a difference between the first lateral distance L1 and the second lateral distance L2. In various embodiments, the second wafer 104 may be shifted from over the first wafer 102 during the bonding process 120 such that the OVL shift is non-zero.

In yet further embodiments, the plurality of second parameters associated with the wafer pins 106a-c during the OVL measurement process 122 may include, the OVL measurement motor signals applied to each motor during the OVL measurement process 122, a speed of each wafer pin 106a-c during the OVL measurement process 122, a torque applied by each motor during the OVL measurement process 122, a number of rotations performed by each driveshaft during the OVL measurement process 122, the plurality of OVL measurement position b1-3, and/or other suitable parameters. In some embodiments, the plurality of second parameters associated with the wafer pins 106a-c during the OVL measurement process 122 (e.g., values from the OVL measurement motor signals, values from the OVL measurement positions b1-3, etc.) may be stored in the memory unit 113. In an embodiment, the OVL shift may, for example, be determined and/or measured by calculating a difference between the plurality of alignment positions a1-3 and the plurality of OVL measurement positions b1-3. In further embodiments, the OVL shift may, for example, be determined and/or measured by performing a comparison between the OVL measurement motor signals and the alignment motor signals. In an embodiment, the plurality of first parameters are different than the plurality of second parameters. For example, the plurality of alignment positions a1-3 are different than the plurality of OVL measurement positions b1-3. In another example, the alignment motor signals are different than the OVL measurement motor signals.

In some embodiments, if the OVL shift is less than an OVL shift threshold, then the bonded first and second wafers 102, 104 are flipped and passed to a trimming apparatus 126. The trimming apparatus 126 is configured to perform a thinning process and/or a trimming process on the first wafer 102. For example, during the thinning process, the trimming apparatus 126 may reduce a thickness of the first wafer 102 by way of a planarization process (e.g., a chemical mechanical polishing (CMP) process), a mechanical grinding process, another suitable thinning process, or any combination of the foregoing. In further embodiments, during the trimming process, the trimming apparatus may remove a peripheral region of the first wafer 102 that overlies a peripheral region 104p of the second wafer 104. In such embodiments, during the trimming process, the notch 102n of the first wafer 102 may be removed and/or a diameter of the first wafer 102 may be reduced. By performing the OVL measurement process 122 after the bonding process 120 and determining that the OVL shift is less than the OVL threshold value, peeling of the first wafer 102 from the second wafer 104 during the trimming process may be mitigated or prevented. This, in part, increases a performance and reliability of semiconductor devices disposed on the first and/or second wafers 102, 104. Further, performing the OVL measurement process 122 ensures that the bonded first and second wafers 102, 104 are not rejected for subsequent processing steps, thereby increasing a yield of the semiconductor manufacturing process.

In further embodiments, if the OVL shift is greater than or equal to the OVL shift threshold, then the bonded first and second wafers 102, 104 are passed to a debonding apparatus 124. The debonding apparatus 124 is configured to perform a debonding process on the bonded first and second wafers 102, 104 to separate the second wafer 104 from the first wafer 102. Further, the debonding apparatus 124 is configured to perform rework process(es) on the first wafer 102 and/or the second wafer 104. The rework process(es) may include performing cleaning process(es), re-deposition process(es), planarization process(es), or other suitable semiconductor processing steps on the first wafer 102 and/or the second wafer 104 to prepare the first and second wafers 102, 104 for subsequent processing steps. For example, after performing the debonding process and/or the rework process(es) on the first and second wafers 102, 104, the first and second wafers 102, 104 may be passed back through the bonding apparatus 114. The first and second wafers 102, 104 may be passed through the bonding apparatus 114 and/or the debonding apparatus 124 until the OVL shift measured during the OVL measurement process 122 is less than the OVL shift threshold. This prevents the bonded first and second wafers 102, 104 from being rejected for subsequent processing stops, thereby reducing waste and time in manufacturing the semiconductor structure and increasing device yield.

It should be noted that the modules and devices in FIG. 1 may all be implemented on one or more processor-based systems. Communication between the different modules and devices may vary depending on how the modules are implemented. If the modules are implemented on one processor-based system, data may be saved in the memory unit 113 between the execution of program code for different steps by the controller 112. The data may then be provided by the controller 112 accessing the memory unit 113 via a bus during the execution of a respective step. If modules are implemented on different processor based systems or if data is to be provided from another storage system, such as a separate memory unit, data can be provided between the systems through an input/output (I/O) interface or a network interface. Similarly, data provided by the devices or stages may be input into one or more processor-based system by the I/O interface or network interface. Thus, it will be appreciated that other variations and modifications in implementing systems and methods are within the scope of the disclosure.

Figure 2A:
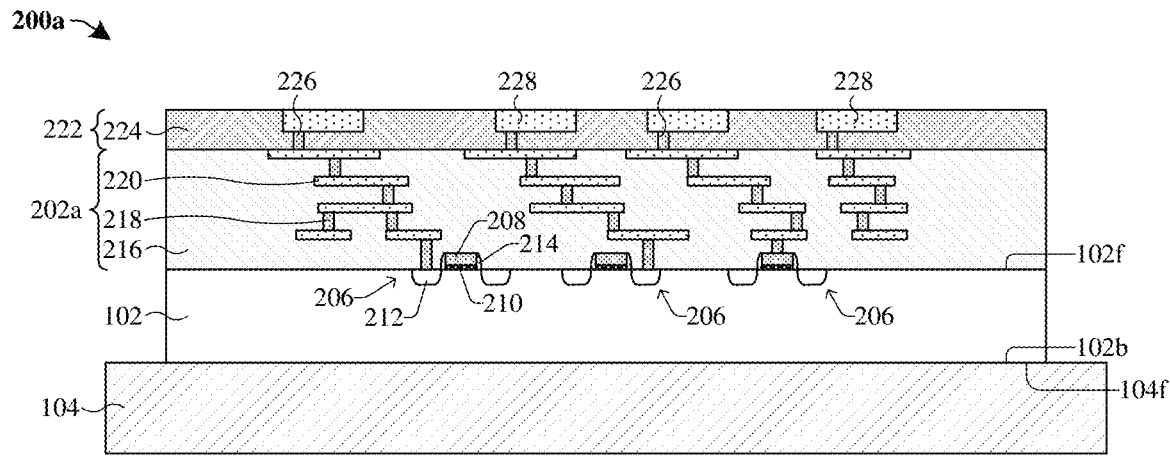
FIGS. 2A and 2B illustrate various embodiments of cross-sectional views of a second wafer bonded to a first wafer.

FIG. 2A illustrates some embodiments of a cross-sectional view 200a of a stack of wafers bonded to one another.

A first wafer 102 overlies a front-side surface 104f of a second wafer 104 such that a back-side surface 102b of the first wafer 102 contacts the front-side surface 104f of the second wafer 104 at a bonding interface. In some embodiments, the first wafer 102 and the second wafer 104 may, for example, be or comprise monocrystalline silicon/CMOS bulk, silicon-germanium (SiGe), silicon on insulator (SOI), or another suitable semiconductor material. A first interconnect structure 202a is disposed along the front-side surface 102f of the first wafer 102. Further, a plurality of semiconductor devices 206 are disposed along and/or on the front-side surface 102f of the first wafer 102. In addition, an input/output (I/O) structure 222 overlies the first interconnect structure 202a.

In some embodiments, the first interconnect structure 202a comprises an interconnect dielectric structure 216, a plurality of conductive vias 218, and a plurality of conductive wires 220. The interconnect dielectric structure 216 may be or comprise one or more inter-level dielectric (ILD) layers and/or one or more inter-metal dielectric (IMD) layers. The plurality of conductive vias and wires 218, 220 are disposed within the interconnect dielectric structure 216 and are configured to electrically couple the semiconductor devices 206 to one another. In some embodiments, the interconnect dielectric structure 216 may, for example, be or comprise low-k dielectric material(s), an oxide (e.g., silicon dioxide), other suitable dielectric material(s), or any combination of the foregoing. In yet further embodiments, the plurality of conductive vias and wires 218, 220 may, for example, respectively be or comprise tungsten, ruthenium, titanium, titanium nitride, tantalum nitride, copper, aluminum, other conductive material(s), or any combination of the foregoing. In yet further embodiments, the first interconnect structure 202a may be or comprise front-end of line (FEOL) devices/layers, middle-end of line (MEOL) devices/layers, and/or back-end of line (BEOL) devices/layers.

In an embodiment, the plurality of semiconductor devices 206 may be configured as transistors and may each comprise a gate electrode 208, a gate dielectric layer 210, a sidewall spacer structure 214, and a pair of source/drain regions 212. The gate dielectric layer 210 is disposed between the gate electrode 208 and the first wafer 102. The sidewall spacer structure 214 is disposed along sidewalls of the gate dielectric layer 210 and sidewalls of the gate electrode 208. Further, the pair of source/drain regions 212 may be disposed within/on the first wafer 102 on opposing sides of the gate electrode 208. In various embodiments, the plurality of semiconductor devices 206 may, for example, each be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a gate-all-around FET (GAAFET), a gate-surrounding FET, a multi-bridge channel FET (MBCFET), a nanowire FET, a nanoring FET, a nanosheet field-effect transistor (NSFET), or the like. It will be appreciated that the plurality of semiconductor devices 206 each being configured as another semiconductor device is also within the scope of the disclosure.

In addition, the I/O structure 222 may, for example, comprise a plurality of upper I/O contacts 228 (e.g., contact pads, sold bumps, etc.) that directly overlie a corresponding I/O via 226. The upper I/O contacts 228 and the upper I/O vias 226 are disposed within an upper dielectric structure 224. The upper I/O contacts 228 are directly electrically coupled to conductive vias and wires 218, 220 within the first interconnect structure 202a. Thus, the upper I/O contacts 228 are electrically coupled to the plurality of semiconductor devices 206 by way of the first interconnect structure 202a. In various embodiments, the I/O structure 222 is configured to provide electrical connections to semiconductor devices disposed within/on the first wafer 102 to another integrated circuit (IC) (not shown).

In various embodiments, during manufacturing of the stack of bonded wafers, the second wafer 104 is bonded to the first wafer 102 by the process(es) and/or steps described in relation to the processing system 100 of FIG. 1. While bonding the second wafer 104 to the first wafer 102 the OVL measurement process is performed by virtue of a plurality of wafer pins to ensure an OVL shift between the first and second wafers 102, 104 is less than an OVL shift threshold. By ensuring that the OVL shift is less than the OVL shift threshold, peeling of layers on the first wafer 102 from the second wafer 104 may be mitigated. For example, after performing the bonding process, a trimming process and/or thinning process is performed on the first wafer 102, layers of the first interconnect structure 202a, and/or layers of the I/O structure 222. Peeling between the first wafer 102, layers of the first interconnect structure 202a, layers of the I/O structure 222, and the second wafer 104 may be prevented/mitigated by performing the OVL measurement process. This, in part, increases a structural integrity of the stack of bonded wafers and increases a performance and/or reliability of semiconductor devices (e.g., 206) disposed within/on the first wafer 102.

Figure 2B:
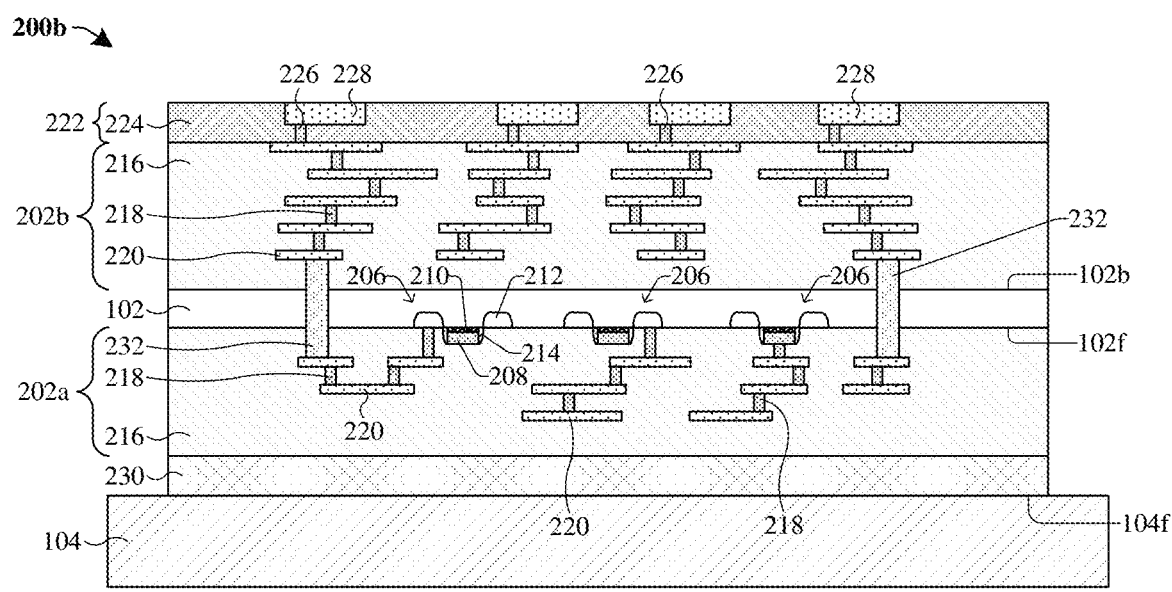

FIG. 2B illustrates a cross-sectional view 200b of some alternative embodiments of the cross-sectional view 200a of FIG. 2A, in which the first interconnect structure 202a is disposed between the first wafer 102 and the second wafer 104.

As illustrated in the cross-sectional view 200b of FIG. 2B, a bonding structure 230 is disposed between the first interconnect structure 202a and the second wafer 104. In various embodiments, during fabrication of the stack of bonded wafers, the second wafer 104 is bonded to the first wafer 102, such that the second wafer 104 and the bonding structure 230 meet at a bond interface. In some embodiments, the bonding structure 230 may, for example, be or comprise an oxide (e.g., silicon dioxide), a high-density oxide, another dielectric material, or any combination of the foregoing. Further, a second interconnect structure 202b is disposed over the back-side surface 102b of the first wafer 102. The first and second interconnect structures 202a, 202b comprise individual interconnect dielectric structures 216, individual pluralities of conductive vias 218, and individual pluralities of conductive wires 220. Further, one or more through-substrate vias (TSVs) 232 extend from the first interconnect structure 202a, through the first wafer 102, to the second interconnect structure 202b. The TSVs 232 are configured to electrically couple the conductive vias and wires 218, 220 within the first and second interconnect structures 202a, 202b to one another. Further, the I/O structure 222 overlies and is electrically coupled to the second interconnect structure 202b.

FIGS. 3-12 illustrate various views of some embodiments of a method for bonding a second wafer to a first wafer using a bonding apparatus that is configured to mitigate misalignment between the first and second wafers according to the present disclosure. Although the various views shown in FIGS. 3-12 are described with reference to a method, it will be appreciated that the structures shown in FIGS. 3-12 are not limited to the method but rather may stand alone separate of the method. Furthermore, although FIGS. 3-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 3:
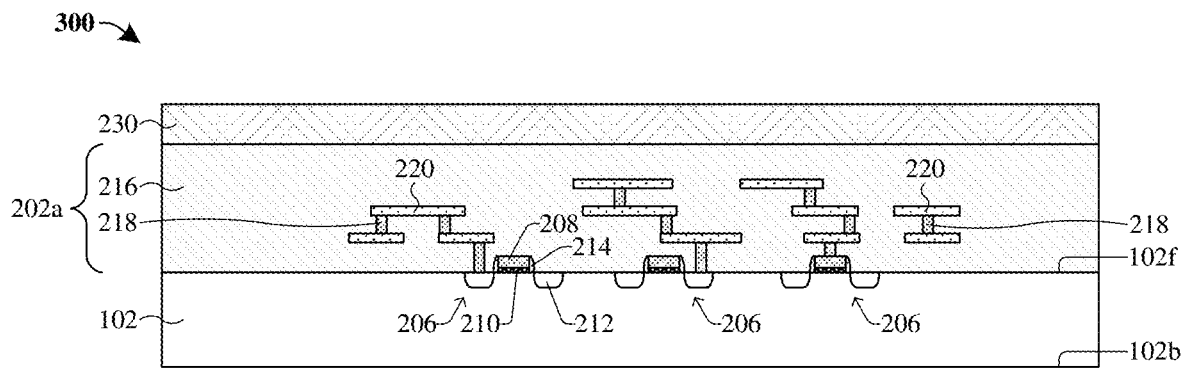
FIGS. 3-12 illustrate some embodiments of various views of a method for bonding a second wafer to a first wafer using a bonding apparatus that is configured to mitigate misalignment between the first and second wafers.

As shown in the cross-sectional view 300 of FIG. 3, a first wafer 102 is provided. In some embodiments, the first wafer 102 comprises any type of semiconductor body (e.g., monocrystalline silicon/CMOS bulk, silicon-germanium (SiGe), silicon on insulator (SOI), etc.). In an embodiment, the first wafer 102 may be referred to as a semiconductor substrate. Further, as shown in FIG. 3, a plurality of semiconductor devices 206, a first interconnect structure 202a, and a bonding structure 230 are formed over/on the first wafer 102, thereby forming a first IC structure. The first interconnect structure 202a includes an interconnect dielectric structure 216, a plurality of conductive vias 218, and a plurality of conductive wires 220. In various embodiments the plurality of semiconductor devices 206 and/or the first interconnect structure 202a may be formed by one or more deposition process(es), one or more patterning process(es), one or more planarization process(es), one or more ion implantation process(es), or some other suitable process(es). In further embodiments, a process for forming the bonding structure 230 may comprise depositing the bonding structure 230 on the interconnect dielectric structure 216 of the first interconnect structure 202a. In some embodiments, the bonding structure 230 may be deposited by chemical vapor deposition (CVD), high-density plasma (HDP) chemical vapor deposition (HDP-CVD), physical vapor deposition (CVD), atomic layer deposition (ALD), some other deposition or growth process, or any combination of the foregoing. In further embodiments, a planarization process (e.g., a chemical mechanical polishing (CMP) process) may be performed on the bonding structure 230 to planarize an upper surface of the bonding structure 230.

Figure 4:
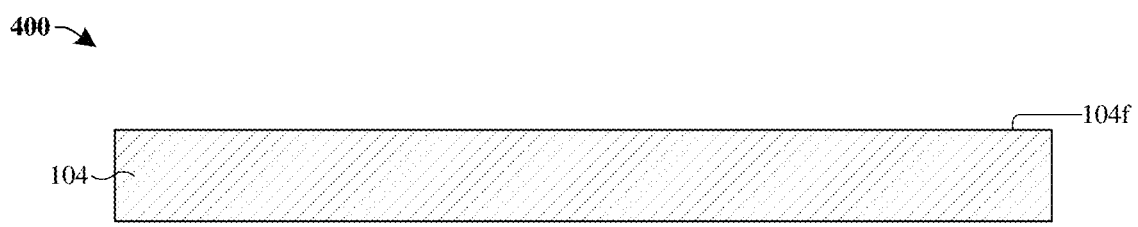

As shown in the cross-sectional view 400 of FIG. 4, a second wafer 104 is provided. In some embodiments, the second wafer 104 comprises silicon, monocrystalline silicon, silicon-germanium (SiGe), or another suitable semiconductor material. In an embodiment, the second wafer 104 may be referred to as a handle wafer.

Figure 5A:
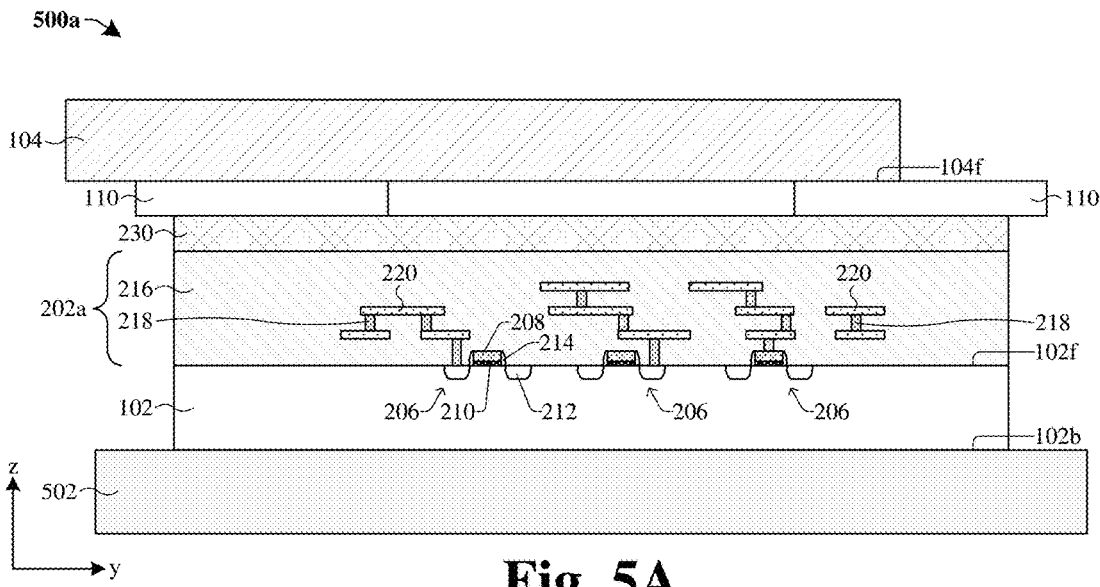
Figure 5B:
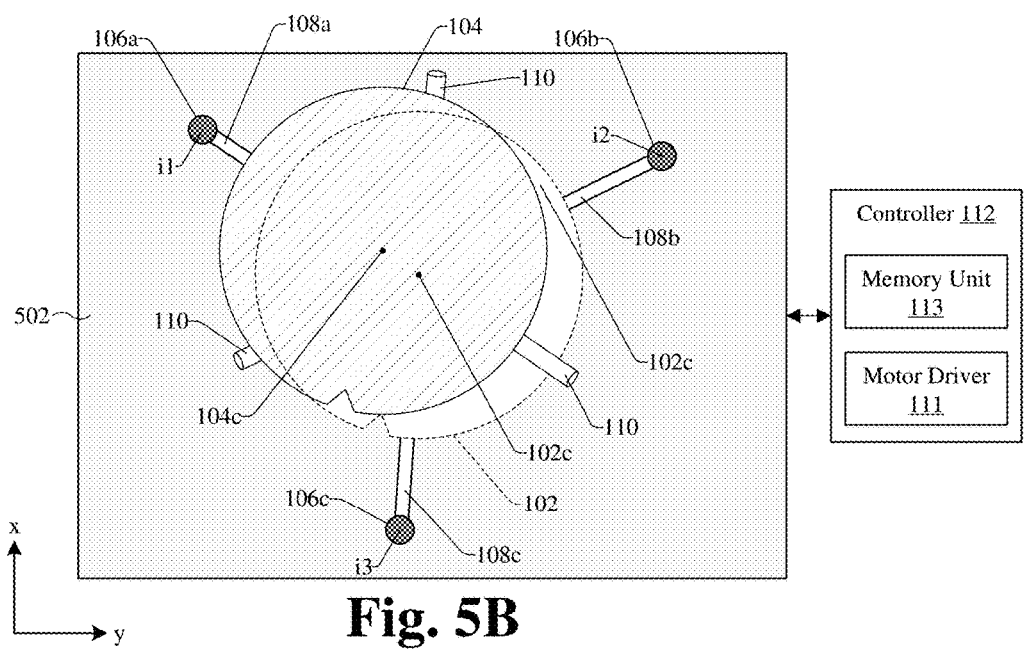

As shown in the cross-sectional view 500a and the top view 500b respectively of FIGS. 5A and 5B, the second wafer 104 is arranged over the first wafer 102 which is disposed on a bonding platform 502 of a bonding apparatus (e.g., 114 of FIG. 1). FIG. 5B illustrates the top view 500b corresponding to some embodiments of the cross-sectional view 500a of FIG. 5A. Further, various features of the cross-sectional view 500a of FIG. 5A may be removed (e.g., the bonding structure 230, the first interconnect structure 202a, etc.) from the top view 500b of FIG. 5B.

In various embodiments, the bonding apparatus (e.g., 114 of FIG. 1) comprises the bonding platform 502, a plurality of wafer pin tracks 108a-c, and a plurality of wafer pins 106a-c disposed on a corresponding wafer pin track 108a-c. The wafer pin tracks 108a-c are disposed on the bonding platform 502 and may be fixed on the bonding platform. Further, each wafer pin 106a-c is disposed on a corresponding wafer pin track 108a-c and are configured to traverse the wafer pin tracks 108a-c by virtue of a motor (not shown). The wafer pins 106a-c comprise a first wafer pin 106a, a second wafer pin 106b, and a third wafer pin 106c. In addition, a plurality of spacer structure 110 are disposed over the first wafer 102 such that the spacer structures 110 are spaced vertically between the second wafer 104 and the bonding structure 230. Further, the wafer pins 106a-c are each disposed at a respective initial position i1-3 on the wafer pin tracks 108a-c. For example, the first wafer pin 106a is disposed at a first initial position i1 along the first wafer pin track 108a, the second wafer pin 106b is disposed at a second initial position i2 along the second wafer pin track 108b, and the third wafer pin 106c is disposed at a third initial position i3 along the third wafer pin track 108c. The initial positions i1-3 may each correspond to a lateral position of a center of each wafer pin 106a-c on the corresponding wafer pin tracks 108a-c. For example, the first initial position i1 may correspond to an initial coordinate position (e.g., an "x" position and a "y" position) of a center of the first wafer pin 106a on an x-y coordinate plane. Further, a controller 112 is configured to control actions of the bonding apparatus (e.g., 114 of FIG. 1) and comprises a motor driver 111 and a memory unit 113. Each wafer pin 106a-c is operably coupled to a corresponding motor that is controlled by the motor driver 111 of the controller 112. In various embodiments, the controller 112 is configured as illustrated and/or described in FIG. 1.

Figure 6A:
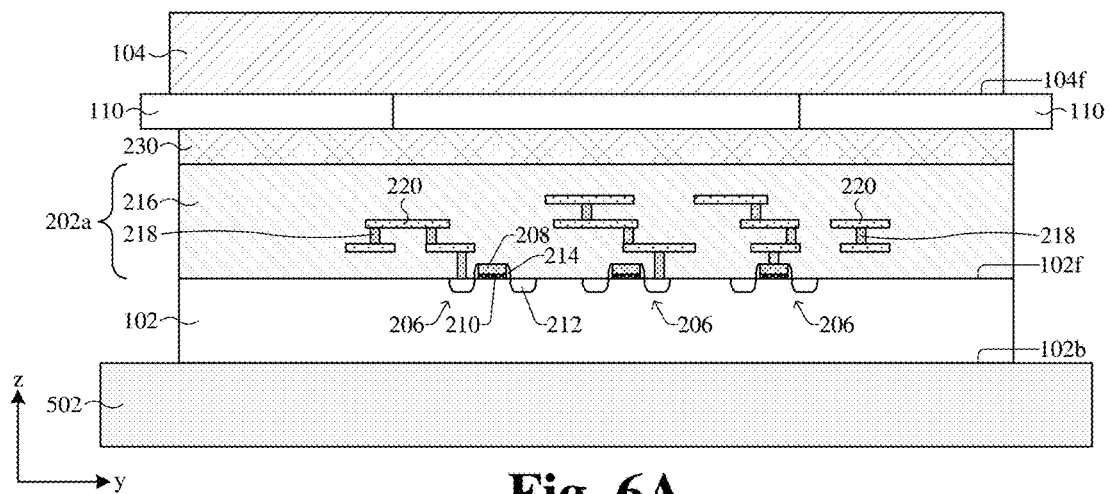
Figure 6B:
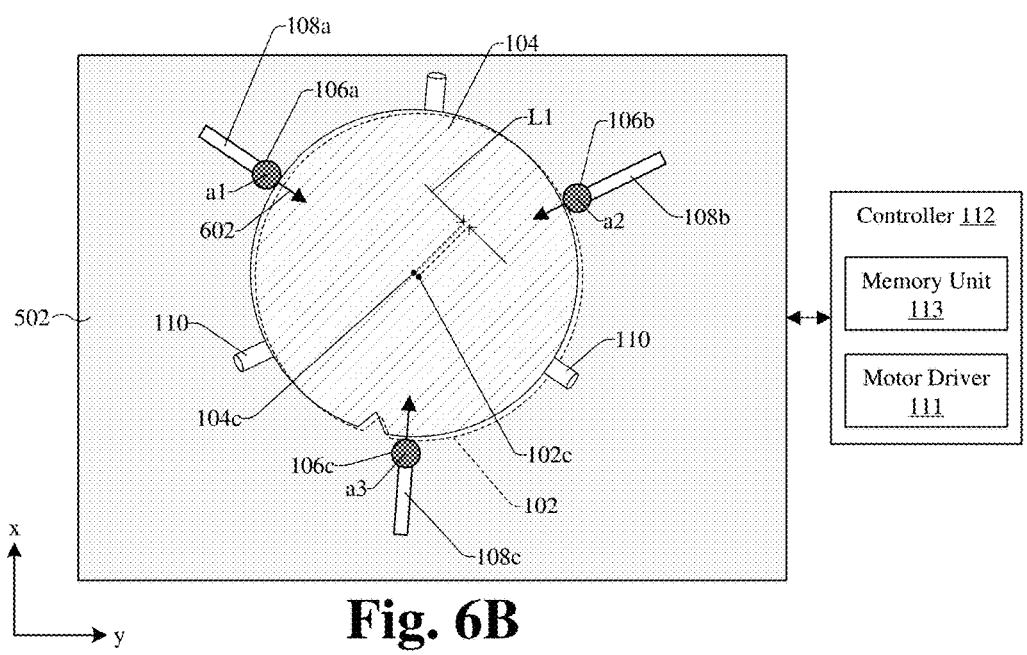

As shown in the cross-sectional view 600a and the top view 600b respectively of FIGS. 6A and 6B, an alignment process (e.g., 118 of FIG. 1) is performed on the first wafer 102 and the second wafer 104 by virtue of the plurality of wafer pins 106a-c, where a plurality of first parameters are associated with the wafer pins 106a-c during the alignment process. FIG. 6B illustrates the top view 600b corresponding to some embodiments of the cross-sectional view 600a of FIG. 6A.

In various embodiments, the alignment process includes applying alignment motor signal(s) to each motor associated with the plurality of wafer pins 106a-c by virtue of the motor driver 111. Application of the alignment motor signals causes each wafer pin 106a-c to traverse the corresponding wafer pin track 108a-c from the initial positions (e.g., i1-3 of FIG. 5B), in a direction towards a center 102c of the first wafer 102, to corresponding alignment positions a1-3. For example, applying a first alignment motor signal to the first motor associated with the first wafer pin 106a causes the first wafer pin 106a to move from the first initial position (e.g., i1 of FIG. 5B) in a first direction 602 towards the center 102c of the first wafer 102. This, in part, facilitates alignment of the second wafer 104 over the first wafer 102. Thus, in some embodiments, the second wafer 104 may be mechanically-aligned over the first wafer 102 by virtue of the plurality of wafer pins 106a-c.

In some embodiments, applying a first alignment motor signal to the first motor associated with the first wafer pin 106a causes the first wafer pin 106a to move from the first initial position (e.g., i1 of FIG. 5B) to a first alignment position a1; applying a second alignment motor signal to the second motor associated with the second wafer pin 106b causes the second wafer pin 106b to move from the second initial position (e.g., i2 of FIG. 5B) to a second alignment position a2; and applying a third alignment motor signal to the third motor associated with the third wafer pin 106c causes the third wafer pin 106c to move from the third initial position (e.g., i3 of FIG. 5B) to a third alignment position a3. In various embodiments, the alignment motor signals may include a voltage, a current, or another signal applied to the motors associated with each wafer pin 106a-c by virtue of the motor driver 111. In various embodiments, values from the first, second, and third alignment motor signals and values from the alignment positions a1-3 may be stored in the memory unit 113 of the controller 112. In yet further embodiments, after the alignment process 118, the center 104c of the second wafer 104 is laterally offset from the center 102c of the first wafer 102 by a first lateral distance L1. The first lateral distance L1 may, for example, be non-zero. In yet further embodiments, after the alignment process 118, the center 104c of the second wafer 104 directly overlies the center 102c of the first wafer 102 (not shown), such that the first lateral distance L1 is zero. In yet further embodiments, the plurality of first parameters associated with the wafer pins 106a-c during the alignment process may include, the alignment motor signals applied to each motor during the alignment process, a speed of each wafer pin 106a-c during the alignment process, a torque applied by each motor during the alignment process, the plurality of alignment positions a1-3, and/or other suitable parameters. In various embodiments, the alignment process is performed without performing an optical alignment process (e.g., an optical alignment process utilizing a light sensor). By omitting the optical alignment process, time and/or cost associated with the alignment process may be reduced.

Figure 7A:
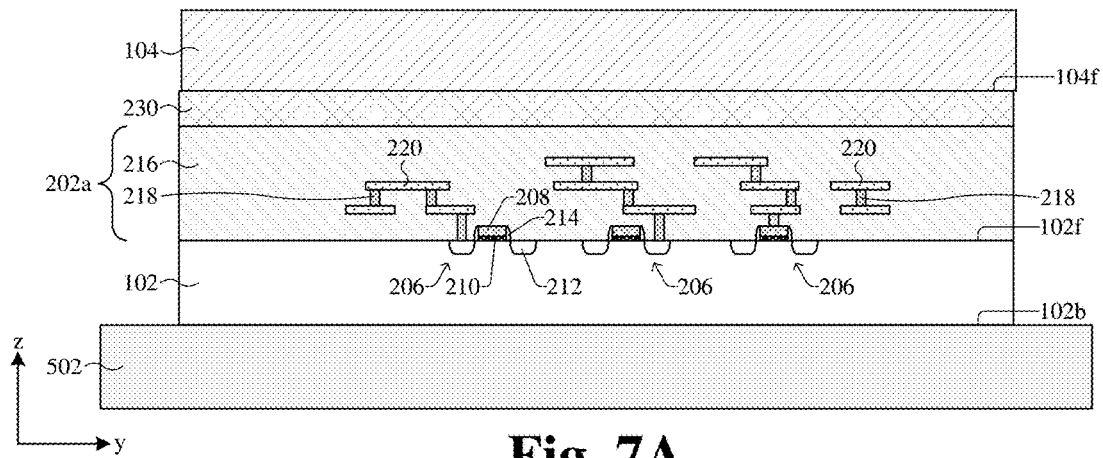
Figure 7B:
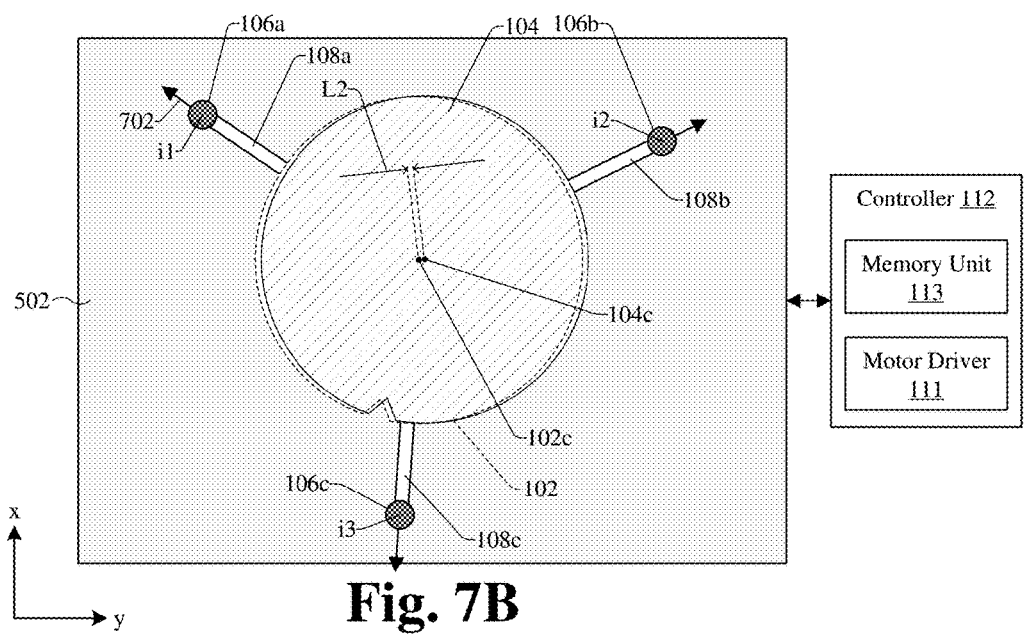

As shown in the cross-sectional view 700a and the top view 700b respectively of FIGS. 7A and 7B, a bonding process (e.g., 120 of FIG. 1) is performed to bond the second wafer 104 to the first wafer 102. FIG. 7B illustrates the top view 700b corresponding to some embodiments of the cross-sectional view 700a of FIG. 7A.

In various embodiments, the bonding process includes removing the spacer structures (110 of FIGS. 6A and 6B) from between the first and second wafers 102, 104; applying motor signal(s) to the motors associated with the plurality of wafer pins 106a-c to move each wafer pin back to a corresponding initial position i1-3; and subsequently bonding the second wafer 104 to the first wafer 102. In various embodiments, the bonding process includes performing a hybrid bonding process, a eutectic bonding process, a fusion bonding process, another suitable bonding process, or any combination of the foregoing. In further embodiments, the center 104c of the second wafer 104 may laterally shift from the center 102c of the first wafer 102 during the bonding process, such that the centers 102c, 104c of the first and second wafers 102, 104 are laterally offset from one another by a second lateral distance L2. In some embodiments, the second lateral distance L2 is different than the first lateral distance (L1 of FIG. 6B). In further embodiments, the second lateral distance L2 is non-zero. In various embodiments, the bonding process is performed without performing an optical alignment process (e.g., an optical alignment process utilizing a light sensor). By omitting the optical alignment process, time and/or cost associated with the bonding process may be reduced.

Figure 8A:
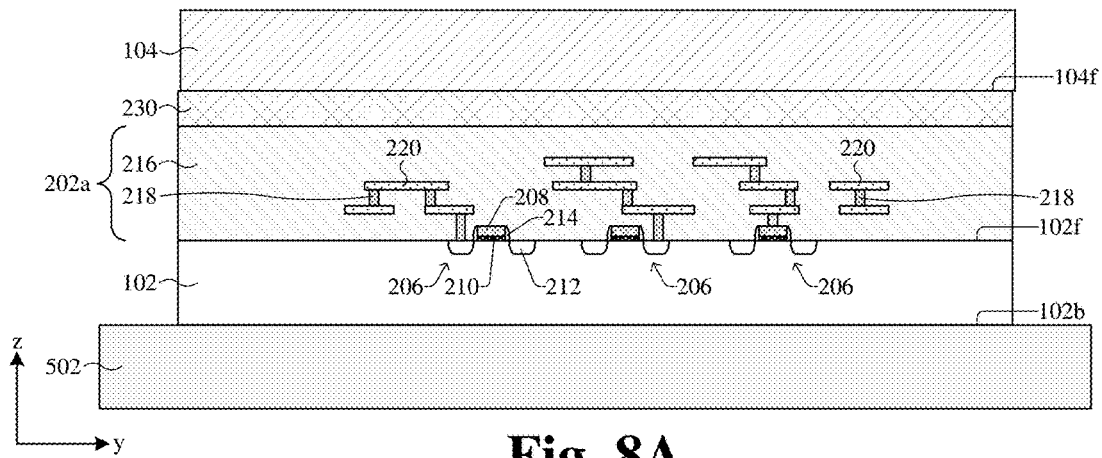
Figure 8B:
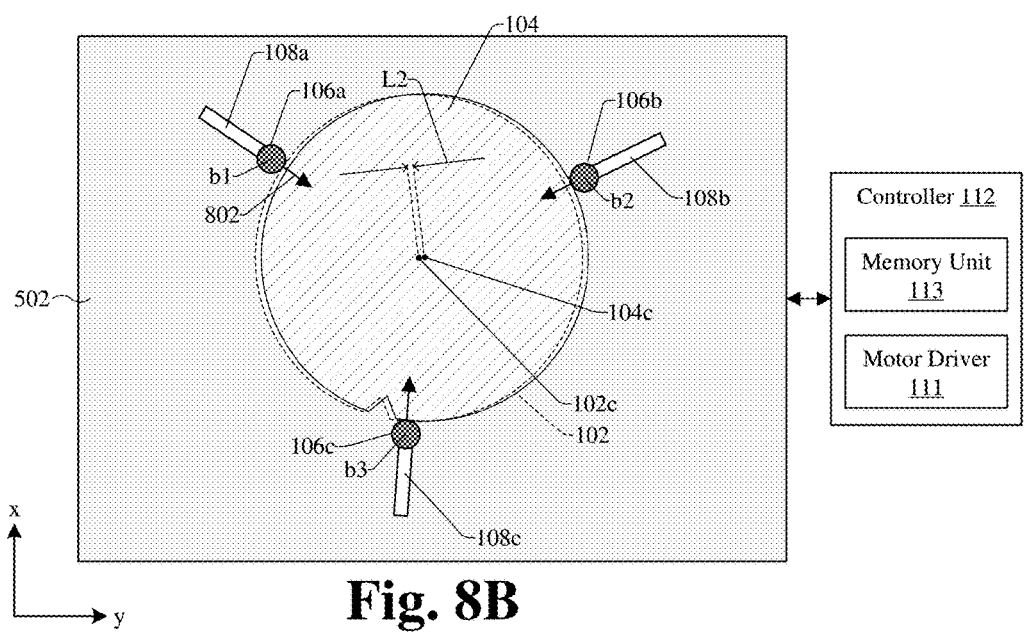

As shown in the cross-sectional view 800a and the top view 800b respectively of FIGS. 8A and 8B, an OVL measurement process (e.g., 122 of FIG. 1) is performed by virtue of the plurality of wafer pins 106a-c, where a plurality of second parameters are associated with the wafer pins 106a-c during the OVL measurement process. FIG. 8B illustrates the top view 800b corresponding to some embodiments of the cross-sectional view 800a of FIG. 8A.

In some embodiments, the OVL measurement process includes applying OVL measurement motor signal(s) (e.g., a current, a voltage, etc.) to each motor associated with the plurality of wafer pins 106a-c by virtue of the motor driver 111. Application of the OVL measurement motor signals causes each wafer pin 106a-c to traverse the corresponding wafer pin track 108a-c from the initial positions i1-3, in a direction towards the bonded first and second wafers 102, 104, to a corresponding OVL measurement position b1-3. For example, applying a first OVL measurement motor signal to the first motor associated with the first wafer pin 106a causes the first wafer pin 106a to move from the first initial position (e.g., i1 of FIG. 7B) in a direction 802 towards the center 102c of the first wafer 102. In various embodiments, values from the OVL measurement motor signals and/or the OVL measurement positions b1-3 may be used to detect and/or determine the second lateral distance L2 between the centers 102c, 104c of the first and second wafers 102, 104. Subsequently, the controller 112 is configured to perform a comparison between the plurality of first parameters associated with the wafer pins 106a-c during the alignment process (e.g., as illustrated and/or described in FIGS. 6A and 6B) and the plurality of second parameters associated with the wafer pins 106a-c during the OVL measurement process to determine and/or measure an OVL shift between centers 102c, 104c of the first and second wafers 102, 104. The OVL shift may, for example, correspond to a difference between the first lateral distance (e.g., L1 of FIG. 6B) and the second lateral distance L2.

In some embodiments, applying the first OVL measurement motor signal to the first motor associated with the first wafer pin 106a causes the first wafer pin 106a to move from the first initial position (e.g., i1 of FIG. 7B) to a first OVL measurement position b1; applying a second OVL measurement motor signal to the second motor associated with the second wafer pin 106b causes the second wafer pin 106b to move from the second initial position (e.g., i2 of FIG. 7B) to a second OVL measurement position b2; and applying a third alignment motor signal to the third motor associated with the third wafer pin 106c causes the third wafer pin 106c to move from the third initial position (e.g., i3 of FIG. 7B) to a third OVL measurement position b3. In various embodiments, the OVL measurement motor signals may include a voltage, a current, or another signal applied to the motors associated with each wafer pin 106a-c by virtue of the motor driver 111.

In yet further embodiments, the plurality of second parameters associated with the wafer pins 106a-c during the OVL measurement process may include, the OVL measurement motor signals applied to each motor during the OVL measurement process, a speed of each wafer pin 106a-c during the OVL measurement process, a torque applied by each motor during the OVL measurement process, the plurality of OVL measurement position b1-3, and/or other suitable parameters. In some embodiments, the plurality of second parameters associated with the wafer pins 106a-c during the OVL measurement process (e.g., values from the OVL measurement motor signals, values from the OVL measurement positions b1-3, etc.) may be stored in the memory unit 113. In an embodiment, the OVL shift may, for example, be determined and/or measured by calculating a difference between the plurality of alignment positions (a1-3 of FIG. 6B) and the plurality of OVL measurement positions b1-3. In further embodiments, the OVL shift may, for example, be determined and/or measured by performing a comparison between the OVL measurement motor signals and the alignment motor signals. In an embodiment, the plurality of first parameters are different than the plurality of second parameters. For example, the plurality of alignment positions (a1-3 of FIG. 6B) are different than the plurality of OVL measurement positions b1-3. In another example, the alignment motor signals are different than the OVL measurement motor signals. In various embodiments, the OVL measurement process is performed without performing an optical OVL measurement process (e.g., an optical OVL measurement process utilizing a light sensor). By omitting the optical OVL measurement process, time and/or cost associated with the OVL measurement process may be reduced.

In various embodiments, if the OVL shift is greater than or equal to an OVL shift threshold, then the method of FIGS. 3-12 may proceed from FIGS. 3-8B to FIGS. 9A-9B. In yet further embodiments, if the OVL shift is less than the OVL shift threshold, then the method of FIGS. 3-12 may alternatively proceed from FIGS. 3-8B to FIGS. 10-12 (i.e., skipping FIGS. 9A-9B).

Figure 9A:
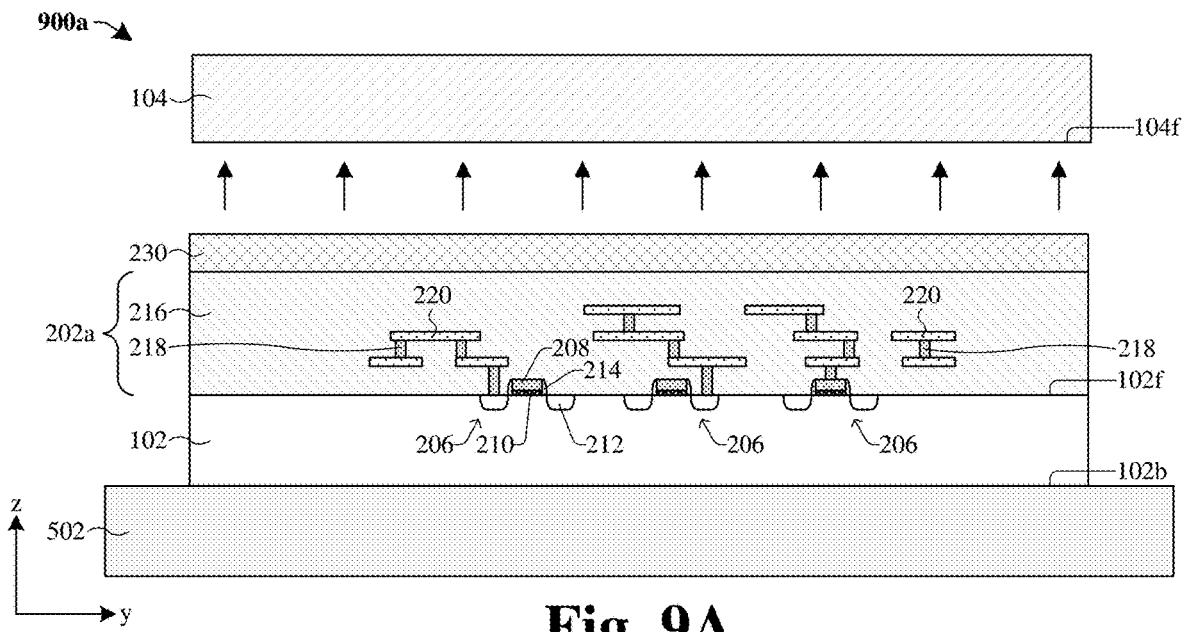
Figure 9B:
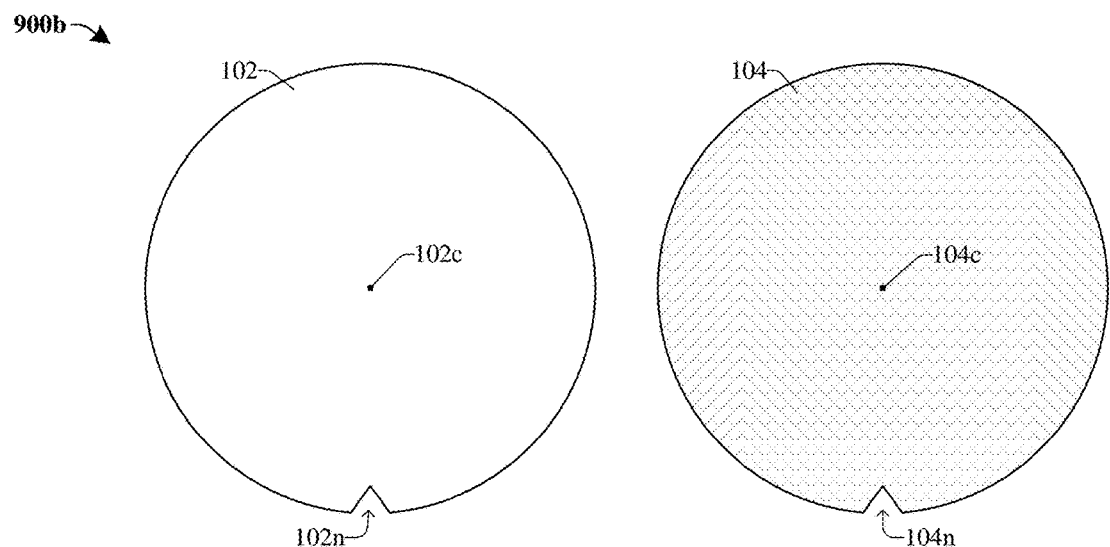

As shown in the cross-sectional view 900a and the top view 900b respectively of FIGS. 9A and 9B, if the OVL shift is greater than or equal to the OVL shift threshold, then a debonding process and a rework process is performed on the first wafer 102 and the second wafer 104. In some embodiments, the debonding process separates the second wafer 104 from the first wafer 102. In further embodiments, the rework process includes performing cleaning process(es), re-deposition process(es), planarization process(es), or other suitable semiconductor processing steps on the first wafer 102 and/or the second wafer 104. In yet further embodiments, after performing the debonding process and/or the rework process, the processing steps illustrated and/or described in FIGS. 3-8B may be performed on the first wafer 102 and the second wafer 104 until the OVL shift is less than the OVL shift threshold.

Figure 10:
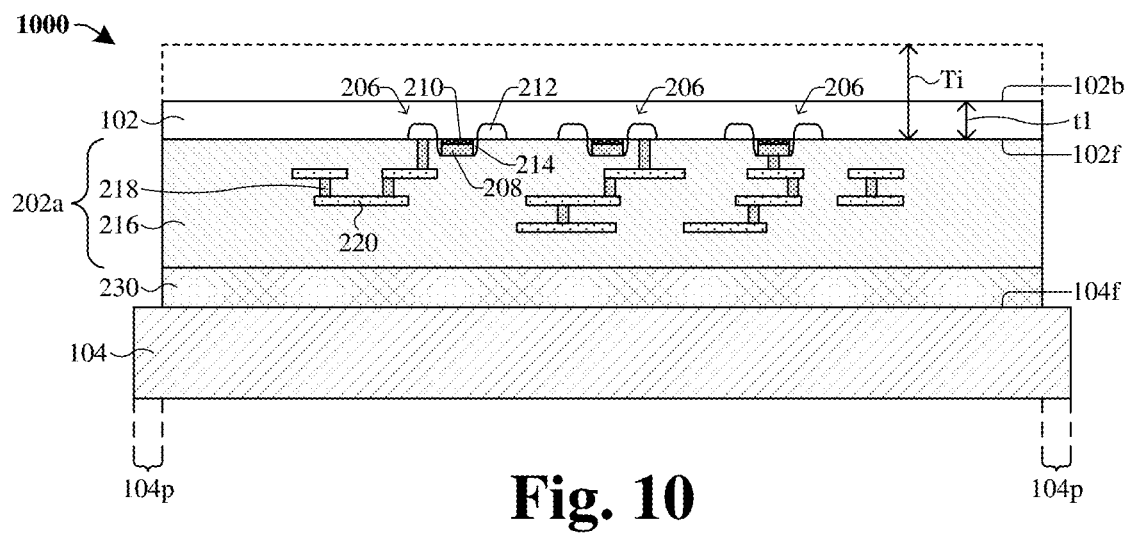

As shown in the cross-sectional view 1000 of FIG. 10, if the OVL shift is less than the OVL shift threshold, then the bonded first and second wafers 102, 104 are flipped and a thinning process and/or a trimming process is/are performed on the first wafer 102. In various embodiments, the thinning process may reduce an initial thickness Ti of the first wafer 102 to a thickness t1. In some embodiments, the thinning process may include performing a CMP process, a mechanical grinding process, another suitable thinning process, or any combination of the foregoing. In further embodiments, the trimming process removes a portion of the first wafer 102, the first interconnect structure 202a, and the bonding structure 230 over a peripheral region 104p of the second wafer 104. In yet further embodiments, the trimming process may, for example, utilize a trimming saw, a trimming laser, another suitable trimming device, or any combination of the foregoing. In some embodiments, after the trimming process a diameter of the first wafer 102 is less than a diameter of the second wafer 104. By determining that the OVL shift is less than the OVL threshold value, peeling of the first wafer 102 from the second wafer 104 during the trimming process may be mitigated or prevented. This, in part, increases a performance and reliability of semiconductor devices (e.g., 206) disposed on the first and/or second wafers 102, 104.

Figure 11:
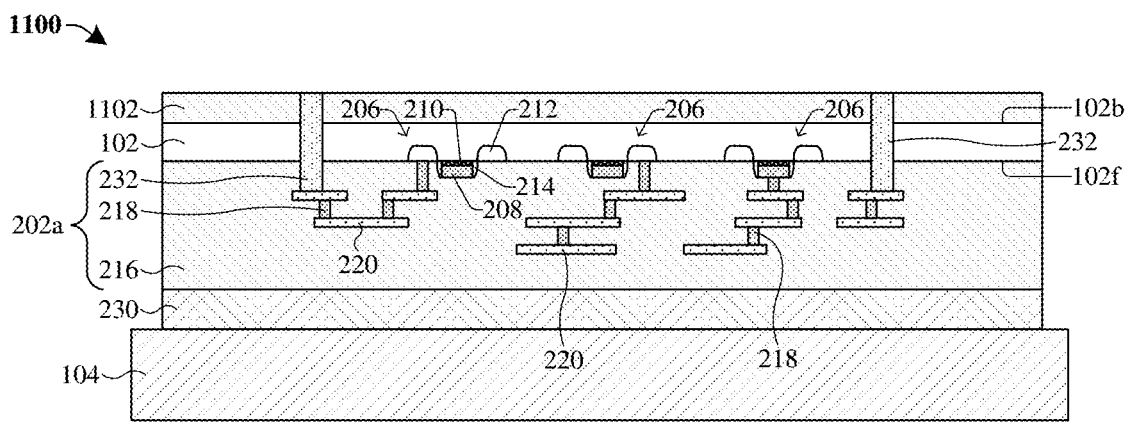

As illustrated in the cross-sectional view 1100 of FIG. 11, an upper dielectric layer 1102 is formed over the first wafer 102, and a plurality of through-substrate vias (TSVs) 232 are formed over the first interconnect structure 202a. In some embodiments, forming the upper dielectric layer 1102 may include depositing the upper dielectric layer 1102 over the back-side surface 102b of the first wafer 102. In various embodiments, the upper dielectric layer 1102 may be deposited by, for example, PVD, CVD, ALD, or another suitable growth or deposition process. The upper dielectric layer 1102 may, for example, be or comprise silicon dioxide, a low-k dielectric material, another dielectric material, or any combination of the foregoing. In further embodiments, a process for forming the TSVs 232 may include: forming a masking layer (not shown) over the upper dielectric layer 1102; patterning the upper dielectric layer 1102, the first wafer 102, and the interconnect dielectric structure 216 according to the masking layer, thereby forming a plurality of TSV openings within the upper dielectric layer 1102, the first wafer 102, and the interconnect dielectric structure 216; depositing a conductive material (e.g., tungsten, copper, aluminum, etc.) within the plurality of TSV openings; and performing a planarization process (e.g., a CMP process) into the conductive material, thereby forming the TSVs 232.

Figure 12:
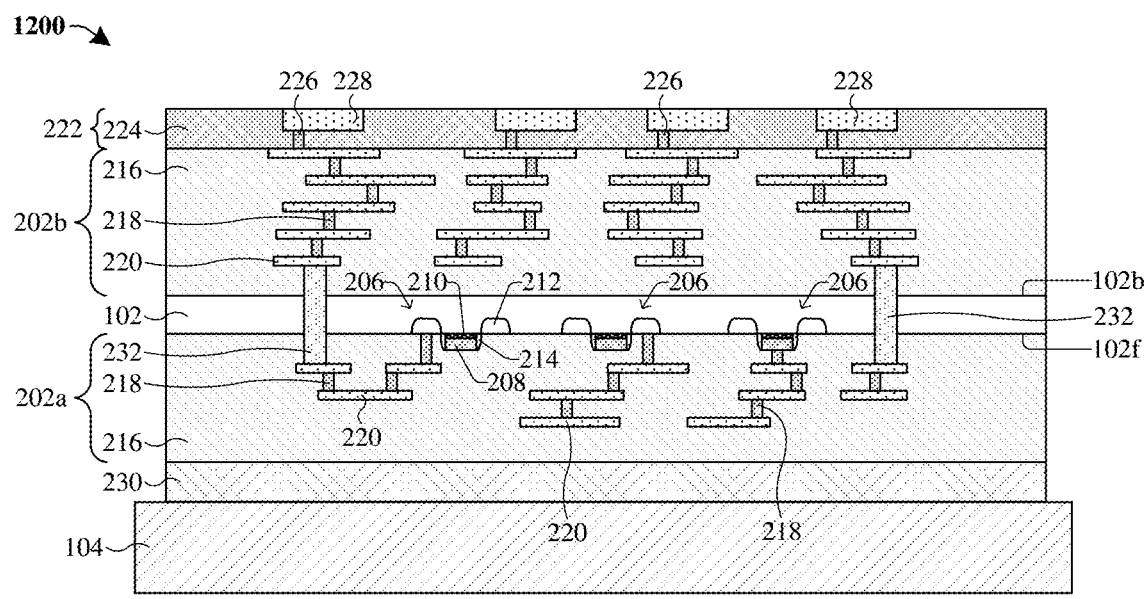

As illustrated in the cross-sectional view 1200 of FIG. 12, a second interconnect structure 202b is formed over the back-side surface 102b of the first wafer 102 and an input/output (I/O) structure 222 is formed over the second interconnect structure 202b. In some embodiments, the second interconnect structure 202b comprises an interconnect dielectric structure 216, a plurality of conductive vias 218, and a plurality of conductive wires 220. The upper dielectric layer (e.g., 1102 of FIG. 11) is part of the interconnect dielectric structure 216 of the second interconnect structure 202b. In addition, the I/O structure 222 may, for example, comprise a plurality of upper I/O contacts 228 (e.g., contact pads, sold bumps, etc.) that directly overlie a corresponding I/O via 226. The upper I/O contacts 228 and the upper I/O vias 226 are disposed within an upper dielectric structure 224. In some embodiments, the second interconnect structure 202b and the I/O structure 222 may be formed by one or more deposition process(es), one or more patterning process(es), one or more planarization process(es), one or more ion implantation process(es), or some other suitable process(es).

Figure 13:
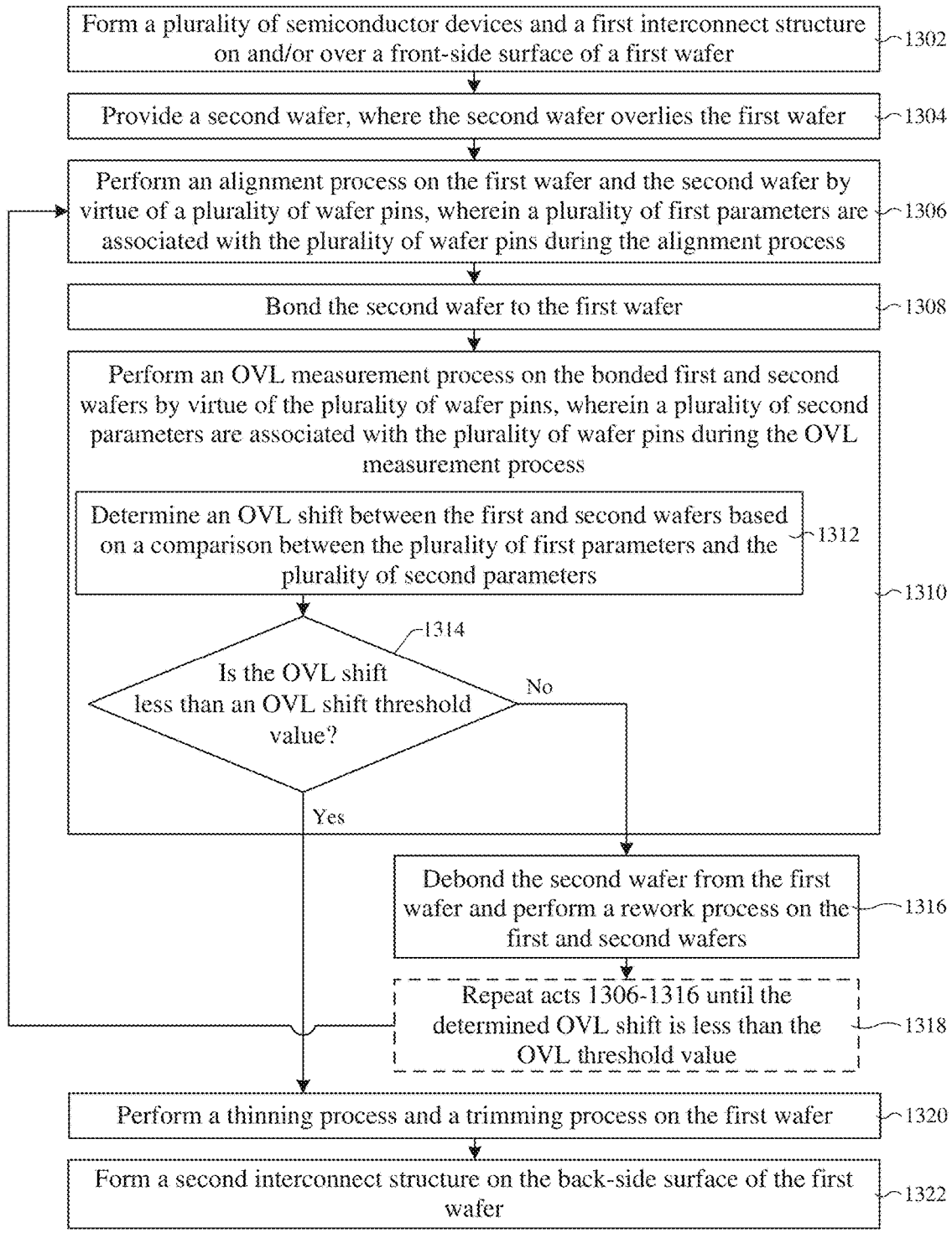
FIG. 13 illustrates a flow diagram of some embodiments of a method for bonding a second wafer to a first wafer using a bonding apparatus that is configured to mitigate misalignment between the first and second wafers.

FIG. 13 illustrates a flow diagram of some embodiments of a method 1300 for bonding a second wafer to a first wafer using a bonding apparatus that is configured to mitigate misalignment between the first and second wafers.

While the method 1300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1302, a plurality of semiconductor devices and a first interconnect structure are formed on and/or over a front-side surface of a first wafer. FIG. 3 illustrates a cross-sectional view 300 corresponding to some embodiments of act 1302.

At act 1304, a second wafer is provided such that the second wafer overlies the first wafer. FIGS. 5A and 5B illustrate various views corresponding to some embodiments of act 1304.

At act 1306, an alignment process is performed on the first wafer and the second wafer by virtue of a plurality of wafer pins, where a plurality of first parameters are associated with the plurality of wafer pins during the alignment process. FIGS. 6A and 6B illustrate various views corresponding to some embodiments of act 1306.

At act 1308, the second wafer is bonded to the first wafer. FIGS. 7A and 7B illustrate various views corresponding to some embodiments of act 1308.

At act 1310, an OVL measurement process is performed on the bonded first and second wafers by virtue of the plurality of wafer pins, where a plurality of second parameters are associated with the plurality of wafer pins during the OVL measurement process. FIGS. 8A and 8B illustrate various views corresponding to some embodiments of act 1310. In yet further embodiments, the OVL measurement process may include performing the acts 1312 and 1314.

At act 1312, an OVL shift is determined between the first and second wafers based on a comparison between the plurality of first parameters and the plurality of second parameters. FIGS. 8A and 8B illustrate various views corresponding to some embodiments of act 1312.

At act 1314, the method determines whether the OVL shift is less than an OVL shift threshold value. The method can make this determination by comparing the OVL shift to the OVL shift threshold value. If the OVL shift is greater than or equal to the OVL shift threshold value, the method proceeds to act 1316 and the second wafer is debonded from the first wafer. Further, a rework process is performed on the first and second wafers. FIGS. 9A and 9B illustrate various views corresponding to some embodiments of act 1316. Further, in some embodiments, at act 1318 the acts 1306-1316 are repeated until the determined OVL shift is less than the OVL threshold value. If the OVL shift is less than the OVL shift threshold value, then the method proceeds to act 1320.

At act 1320, a thinning process and a trimming process are performed on the first wafer. FIG. 10 illustrates a cross-sectional view 1000 corresponding to some embodiments of act 1320.

At act 1322, a second interconnect structure is formed on the back-side surface of the first wafer. FIGS. 11 and 12 illustrate cross-sectional views 1100 and 1200 corresponding to some embodiments of act 1322.

Accordingly, in some embodiments, the present disclosure relates to a method for forming a stack of bonded wafers. The method includes performing an alignment process on a first wafer and a second wafer by virtue of a plurality of wafer pins, wherein a plurality of first parameters are associated with the wafer pins during the alignment process. The second wafer is bonded to the first wafer. Subsequently, an OVL measurement process is performed on the bonded first and second wafers by virtue of the plurality of wafer pins, where a plurality of second parameters are associated with the wafer pins during the OVL measurement process. Further, an OVL shift is determined by performing a comparison between the plurality of first parameters and the plurality of second parameters.

In some embodiments, the present application provides a method for forming a semiconductor structure, the method includes: loading a first wafer and a second wafer onto a bonding platform such that the second wafer overlies the first wafer; performing an alignment process to align the second wafer over the first wafer by virtue of a plurality of wafer pins, wherein a plurality of first parameters are associated with the wafer pins during the alignment process; bonding the second wafer to the first wafer; performing an overlay (OVL) measurement process on the first wafer and the second wafer by virtue of the plurality of wafer pins, wherein a plurality of second parameters are associated with the wafer pins during the alignment process; and determining an OVL shift between the first wafer and the second wafer based on a comparison between the first parameters associated with the wafer pins during the alignment process and the second parameters associated with the wafer pins during the OVL measurement process.

In some embodiments, the present application provides a method for forming a semiconductor structure, the method includes: forming a first interconnect structure along a front-side surface of a first wafer; loading the first wafer and a second wafer onto a bonding platform such that the second wafer overlies the first interconnect structure; performing a mechanical alignment process to align the second wafer over the first wafer, wherein the mechanical alignment process comprises guiding the second wafer over the first wafer by virtue of a plurality of wafer pins such that the plurality of wafer pins contact the first wafer and/or the second wafer at a plurality of alignment positions; bonding the first wafer to the second wafer such that a center of the first wafer is laterally offset from a center of the second wafer by a non-zero distance; and determining an overlay (OVL) shift between the first wafer and the second wafer, wherein determining the OVL shift comprises moving the plurality of wafer pins from a plurality of initial positions to a plurality of measurement positions and determining a difference between the plurality of alignment positions and the plurality of measurement positions.

In some embodiments, the present application provides a method for forming a semiconductor structure, the method includes: forming a plurality of semiconductor devices on a front-side surface of a first wafer; forming an interconnect structure along the front-side surface of the first wafer; providing a second wafer, wherein the second wafer overlies the interconnect structure; performing an alignment process on the second wafer and the first wafer by virtue of a plurality of wafer pins, wherein a plurality of motors associated with the wafer pins are configured to move the wafer pins across a corresponding track during the alignment process, wherein a plurality of first parameters are associated with the wafer pins during the alignment process, and wherein a center of the second wafer is laterally offset from a center of the first wafer by a first lateral distance after the alignment process; bonding the second wafer to the first wafer such that the center of the first wafer is laterally offset from the center of the second wafer by a second lateral distance different than the first lateral distance; performing an overlay (OVL) measurement process on the first and second wafers by virtue of the plurality of wafer pins, wherein the plurality of motors associated with the wafer pins are configured to move the wafer pins across the corresponding track during the OVL measurement process, wherein a plurality of second parameters are associated with the wafer pins during the OVL measurement process; and determining an OVL shift by performing a comparison between the first parameters and the second parameters, wherein the OVL shift corresponds to a difference between the first lateral distance and the second lateral distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    loading a first wafer and a second wafer onto a bonding platform such that the second wafer overlies the first wafer;
    performing an alignment process to align the second wafer over the first wafer by virtue of a plurality of wafer pins, wherein the plurality of wafer pins are disposed outside of outer sidewalls of the first and second wafers, wherein a plurality of first parameters are associated with the wafer pins during the alignment process;
    bonding the second wafer to the first wafer;
    performing an overlay (OVL) measurement process on the first wafer and the second wafer by virtue of the plurality of wafer pins, wherein a plurality of second parameters are associated with the wafer pins during the OVL measurement process; and
    determining an OVL shift between the first wafer and the second wafer based on a comparison between the first parameters associated with the wafer pins during the alignment process and the second parameters associated with the wafer pins during the OVL measurement process.

2. The method of claim 1, further comprising:
    determining that the OVL shift is less than an OVL threshold value; and
    performing a trimming process on the first wafer to remove a portion of the first wafer from above a peripheral region of the second wafer, wherein after the trimming process a diameter of the first wafer is less than a diameter of the second wafer.

3. The method of claim 1, further comprising:
    determining that the OVL shift is greater than an OVL threshold value;
    debonding the second wafer from the first wafer; and
    performing a rework process on the first wafer and the second wafer.

4. The method of claim 1, further comprising:
    determining alignment positions of the plurality of wafer pins during the alignment process, wherein the first parameters include the alignment positions;
    determining measurement positions of the plurality of wafer pins during the OVL measurement process, wherein the second parameters include the measurement positions; and wherein the alignment positions are different than the measurement positions, wherein determining the OVL shift includes performing a comparison between the alignment positions and the measurement positions.

5. The method of claim 1, wherein the alignment process comprises:
moving the wafer pins from a plurality of initial positions, in a direction towards a center of the first wafer, to a plurality of alignment positions such that the wafer pins respectively contact a circumferential edge of the first wafer and/or a circumferential edge of the second wafer.

6. The method of claim 5, wherein bonding the second wafer to the first wafer comprises:
moving the wafer pins from the plurality of alignment positions, in a direction away from the center of the first wafer, to the plurality of initial positions.

7. The method of claim 1, wherein the OVL measurement process comprises:
moving the wafer pins from a plurality of initial positions, in a direction towards a center of the first wafer, to a plurality of measurement positions such that the wafer pins respectively contact a circumferential edge of the first wafer and/or a circumferential edge of the second wafer.

8. The method of claim 7, wherein moving the plurality of wafer pins includes:
applying measurement motor signals to a plurality of motors that are respectively associated with a corresponding wafer pin in the plurality of wafer pins, wherein the second parameters include the measurement motor signals.

9. The method of claim 8, wherein the measurement motor signals include a voltage and/or a current.

10. The method of claim 1, wherein after the alignment process a center of the second wafer is laterally offset from a center of the first wafer by a first lateral distance, wherein after bonding the first wafer to the second wafer the center of the second wafer is laterally offset from the center of the first wafer by a second lateral distance, wherein the first lateral distance is different from the second lateral distance.

11. The method of claim 1, wherein the second wafer is bonded to the first wafer without optical alignment.

12. A method for forming a semiconductor structure, comprising:
forming a first interconnect structure along a front-side surface of a first wafer;
loading the first wafer and a second wafer onto a bonding platform such that the second wafer overlies the first interconnect structure;
performing a mechanical alignment process to align the second wafer over the first wafer, wherein the mechanical alignment process comprises guiding the second wafer over the first wafer by virtue of a plurality of wafer pins such that the plurality of wafer pins contact the first wafer and/or the second wafer at a plurality of alignment positions, wherein the wafer pins are separate from the first and second wafers;
bonding the first wafer to the second wafer such that a center of the first wafer is laterally offset from a center of the second wafer by a non-zero distance; and
determining an overlay (OVL) shift between the first wafer and the second wafer, wherein determining the OVL shift comprises moving the plurality of wafer pins from a plurality of initial positions to a plurality of measurement positions and determining a difference between the plurality of alignment positions and the plurality of measurement positions.

13. The method of claim 12, further comprising:
determining whether the OVL shift is less than an OVL threshold value; and
performing a thinning process and a trimming process on the first wafer if the OVL shift is less than the OVL threshold value.

14. The method of claim 12, wherein the plurality of alignment positions are different than the plurality of measurement positions.

15. The method of claim 12, further comprising:
determining whether the OVL shift is greater than or equal to an OVL threshold value; and
performing a debonding process on the second wafer and the first wafer if the OVL shift is greater than or equal to the OVL threshold value.

16. The method of claim 15, further comprising:
performing a rework process on the first wafer and the second wafer after performing the debonding process.

17. A method for forming a semiconductor structure, comprising:
forming a plurality of semiconductor devices on a front-side surface of a first wafer;
forming an interconnect structure along the front-side surface of the first wafer;
providing a second wafer, wherein the second wafer overlies the interconnect structure;
performing an alignment process on the second wafer and the first wafer by virtue of a plurality of wafer pins, wherein a plurality of motors associated with the wafer pins are configured to move the wafer pins across a corresponding track during the alignment process, wherein a plurality of first parameters are associated with the wafer pins during the alignment process, and wherein a center of the second wafer is laterally offset from a center of the first wafer by a first lateral distance after the alignment process;
bonding the second wafer to the first wafer such that the center of the first wafer is laterally offset from the center of the second wafer by a second lateral distance different than the first lateral distance;
performing an overlay (OVL) measurement process on the first and second wafers by virtue of the plurality of wafer pins, wherein the plurality of motors associated with the wafer pins are configured to move the wafer pins across the corresponding track during the OVL measurement process, wherein a plurality of second parameters are associated with the wafer pins during the OVL measurement process; and
determining an OVL shift by performing a comparison between the first parameters and the second parameters, wherein the OVL shift corresponds to a difference between the first lateral distance and the second lateral distance.

18. The method of claim 17, wherein the plurality of first parameters comprise alignment motor signals applied to each motor during the alignment process, and wherein the plurality of second parameters comprise OVL measurement motor signals applied to each motor during the OVL measurement process.

19. The method of claim 17, wherein the plurality of first parameters comprise first distances traveled by the plurality of wafer pins during the alignment process, and wherein the plurality of second parameters comprise second distances traveled by the plurality of wafer pins during the OVL measurement process.

20. The method of claim 17, wherein the alignment process is performed without optical alignment.

\* \* \* \* \*